United States Patent [19]

Liebel

[11] Patent Number: 4,521,719
[45] Date of Patent: Jun. 4, 1985

[54] ION BEAM GUN

[75] Inventor: Gerhard Liebel, Munich, Fed. Rep. of Germany

[73] Assignee: Technics GmbH Europa, Kirchheim, Fed. Rep. of Germany

[21] Appl. No.: 412,172

[22] Filed: Aug. 27, 1982

[30] Foreign Application Priority Data

Aug. 31, 1981 [DE] Fed. Rep. of Germany ....... 3134337

[51] Int. Cl.³ .......................... H01J 7/24; H05B 31/26
[52] U.S. Cl. .......................... 315/111.81; 250/423 R; 315/111.31; 313/360.1; 313/363.1
[58] Field of Search .......................... 315/111.81, 111.91, 315/248, 111.41, 39, 111.21, 111.31; 313/230, 231, 360.1, 362.1, 363.1; 250/423 R

[56] References Cited

U.S. PATENT DOCUMENTS

| 3,015,745 | 1/1962 | Klein | 313/363.1 |
| 3,476,968 | 11/1969 | Omura | 313/362.1 |
| 3,956,666 | 5/1976 | Reader et al. | 315/111.81 |
| 4,220,545 | 9/1980 | Franzen et al. | 313/362.1 |
| 4,339,691 | 7/1982 | Morimiya et al. | 315/111.41 |
| 4,367,429 | 1/1983 | Wang et al. | 313/362.1 |

Primary Examiner—Saxfield Chatmon
Attorney, Agent, or Firm—Lilling & Greenspan

[57] ABSTRACT

The invention relates to an ion beam gun having a pair of electrodes for applying a high-frequency high voltage to ionize an ionization gas, the ions produced being extracted by an extraction electrode arranged behind the pair of electrodes in the direction of the ion beam (FIG. 1).

6 Claims, 2 Drawing Figures

ION BEAM GUN

BACKGROUND OF THE INVENTION

In J. Vac. Sci. Technol. 16 (1970) 1880 (especially FIG. 1), Sharp et al. describe an ion beam gun in the case of which a plasma is produced using a heating filament. The cations formed are held together in a field produced by permanent magnets or electromagnets, extracted from the ionization chamber using an extraction electrode and directed in the form of one or more beams (4 beams in FIG. 1) onto a substrate.

In the case of this known ion beam gun, the following features are, however, not satisfactory. Owing, especially, to the inhomogeneous magnetic field, the greatest field density of which lies approximately in the axis of the ionization chamber, the gas discharge is inhomogeneous. Because of this inhomogeneity, a complicated and expensive perforation must be made in the extraction electrode. It is not possible to achieve any desired shape of beam cross-section or any desired size of beam cross-section. Furthermore, there are restrictions with respect to the selection and durability of the material of the heating filament. Only limited use can be made of reactive ionization gases. Finally, in addition to the use of magnets, the expense of four supplies of current is not very satisfactory.

In the case of the known dual plasmatron, apart from the fact that a heating filament is not used, but the ion beam is produced using two plasmas, this known device has corresponding disadvantages (development by, inter alia, Schott).

SUMMARY OF THE INVENTION

These disadvantages of the prior art are now overcome according to the invention in that a plasma is produced in a high-frequency high voltage field. According to the invention, for this purpose, an ion beam gun is provided with an ionization chamber which is provided with an ionization gas inlet, an ionization gas outlet, a pair of electrodes for ionizing the ionization gas and a perforated, that is to say permeable to ion beams, extraction electrode, the ion beam gun being characterised in that in the case of the pair of electrodes there are two electrodes for applying the high-frequency high voltage which lie opposed to each other in the direction of the ion beam and the extraction electrode is arranged behind the pair of electrodes in the direction of the ion beam.

Although the field of ion beam guns has experienced active development for many years, the gas has, hitherto, been discharged only by high voltage discharge or using electron emission from heating filaments. It has now been shown, however, that also for a high-frequency high voltage an ion beam gun can be designed which can be used in all the known fields of use for ion beam guns, for example: etching and application of thin layers in manufacturing integrated circuits, bubble memories, integrated optics and similar applications in semiconductor processing; electron microscopy, for example thinning preparations; surface processing, such as removing etching, etching slightly, polishing, structuring and doping.

The ion beam gun according to the invention, offers, inter alia, the following advantages:

1. Substantially relatively homogeneous gas discharge owing to uniform high-frequency field;
2. Relatively high beam current density;
3. Since heating filaments are not provided, reactive ionization gases can also be used. For example, $F_2$, $Cl_2$, $H_2$, $O_2$, noble gases and freons which offer new processing possibilities, anisotropy etc. can be used as ionization or bombardment gases.
4. Flat structure.
5. No magnetic fields.
6. Since it is not necessary to work in an (necessarily) inhomogeneous magnetic field, it is possible to achieve any desired shape of beam cross-section and any desired size of beam cross-section.
7. The supply of current is relatively simple.
8. The whole construction of the ion beam gun is relatively simple and therefore economic.
9. High variability with respect to the materials for constructing the ionization chamber and the extraction electrode.

According to one design, the first electrode in the direction of the ion beam can be connected as the earth and, according to a second design, the second electrode in the direction of the ion beam can be connected as the earth.

In the case of a further design, the second electrode in the direction of the ion beam and the extraction electrode are provided, in each case, with one or more passages for the ion beam which are arranged in alignment. An analogous design for four perforations in each case is to be found in Sharp et al., loc. cit. FIG. 1.

Finally, in the case of one design, the extraction electrode is arranged so that it is displaceable with respect to its distance to the second electrode in the direction of the ion beam.

The ion beam gun according to the invention is operated, for example, at a voltage within the range of from 0.5 to 10 kV, and preferably from 1 to 2 kV, at a high frequency within the range of from 10 to $2 \times 10^6$ kHz (LF: from 10 to 450 kHz, RF: from 450 to $2 \times 10^6$ kHz) and preferably from $10^3$ to $10^5$ kHz (approximately $2.7 \times 10^4$ kHz) and at a pressure within the range of from $10^{-3}$ to $10^{-6}$, and preferably from $10^{-4}$ $10^{-5}$, torr. For the extraction electrode, a negative potential with respect to the second electrode in the direction of the ion beam within the range of from 0 to 10,000 V, and preferably from 500 to 1000 V is selected.

BRIEF DESCRIPTION OF THE DRAWINGS

The invention is explained in detail below by means of the Figures.

DESCRIPTION OF THE PREFERRED EMBODIMENTS

Figure 1:
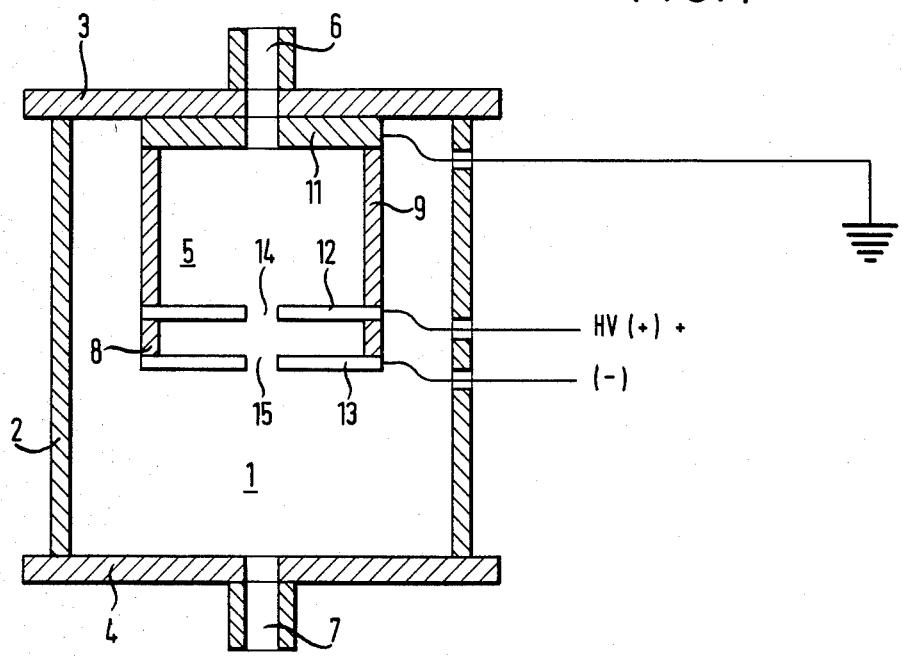
FIG. 1 shows an ion beam gun according to the invention in the case of which the first electrode in the direction of the ion beam is connected as the earth.

The ion beam gun 1 represented in FIG. 1 is formed by a cylinder 2 which is closed at its two ends by flanges 3, 4. The cylinder 2 and the flanges 3, 4 may consist of refined steel. The actual ionization chamber 5 is in the ion beam gun 1 and is formed by a cylinder 9 consisting, for example, of glass, the end faces of which cylinder are closed by electrodes 11, 12. The first electrode 11 in the direction of the ion beam is mounted on the flange 3.

Each of the two electrodes 11, 12 is provided with a perforation, the perforation of the electrode 11 extending the ionization gas inlet 6 of the flange 3. An extraction electrode 13 is arranged behind the electrode 12 in the direction of the ion beam. This extraction electrode 13 is supported by brackets 8 and insulated with respect to the electrode 12, the brackets 8 being supported by the cylinder 9. The extraction electrode 13 is provided with a perforation 15 which is in alignment with the perforation 14 of the electrode 12. It is not necessary for the electrode 12 and the extraction electrode 13 each to have only one perforation, but each of them may have several perforations which, again may be in alignment with one another. The two electrodes 12, 13 can therefore be in the form of a grid or a lattice. The electrode 11 is connected as the earth. A high-frequency high voltage potential is applied to the electrode 12 and a negative potential with respect thereto is applied to the electrode 13. Each of the three electrodes shown in FIG. 1 is guided in insulated manner through the cylinder walls of the ion beam gun 1. The man skilled in the art is familiar with the selection of suitable materials for the electrodes of a high-frequency high voltage field and for extraction electrodes. The ion beam emerging through the perforation 15 can be directed onto a substrate which is arranged between the perforation 15 and ionization gas outlet 7.

Figure 2:
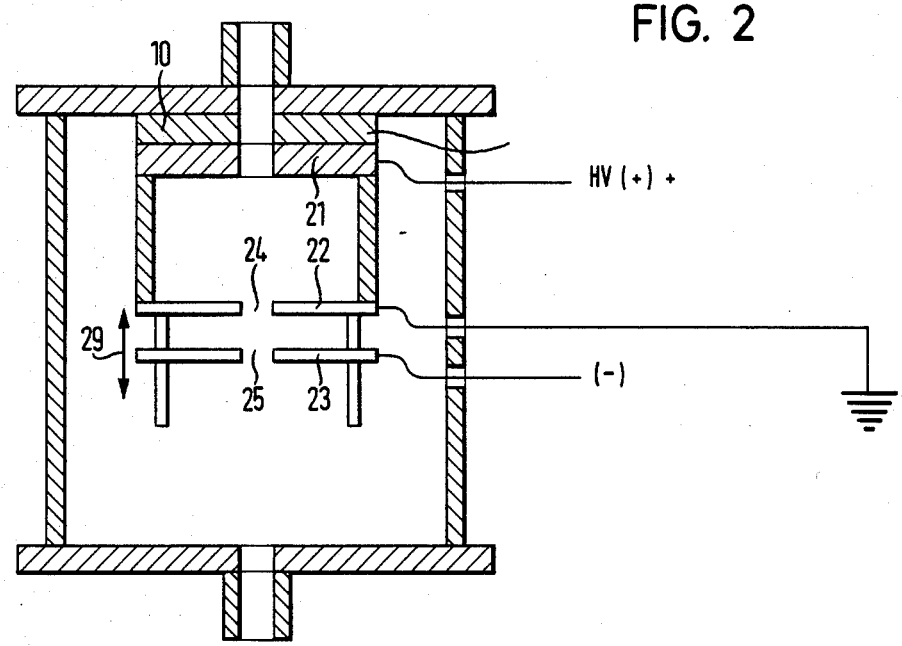
FIG. 2 shows an ion beam gun according to the invention in the case of which the second electrode in the direction of the ion beam is connected as the earth and the extraction electrode is arranged so that it is displaceable with respect to this second electrode.

Apart from the following modifications, the ion beam gun shown in FIG. 2 is constructed in identical manner. These modifications consist in the high-frequency high voltage being applied to the first electrode 21 in the direction of the ion beam. Insofar as the flange of the ion beam gun provided with the ionization gas inlet does not consist of an insulating material, the electrode 21 is mounted on an insulator 10 which is supported by a flange. In corresponding manner, the second electrode 22 in the direction of the ion beam is connected as the earth. The extraction electrode 23 has a negative potential with respect to the electrode 22. The extraction electrode 23 is displaceably mounted on guide rods (insulators) 29 which are supported by the electrode 22 or the cylinder of the ionization chamber.

I claim:

1. Ion beam gun comprising an ionization chamber which is provided with an ionization gas inlet and an ionization gas outlet, two ionization electrodes spaced from and in opposition to each other in the direction of the ion beam for ionizing the ionization gas; an extraction electrode permeable to the ion beams, said extraction electrode being arranged behind said two ionization electrodes in the direction of the ion beam; means for applying a high frequency and a high voltage to said two ionization electrodes, one of said two ionization electrodes, disposed between the other of said two ionization electrodes and said electrodes, and said extraction electrode each being provided with passages arranged in alignment with each other for passage of the ion beam.

2. Ion beam gun according to claim 1, characterized in that
    the first electrode (11, 21) in the direction of the ion beam is connected as the earth.

3. Ion beam gun according to claim 1, characterized in that the extraction electrode (23) is arranged so that it is displaceable with respect to its distance to the second electrode (22) in the direction of the ion beam.

4. Ion beam gun according to claim 1, characterized in that the second electrode (12; 22) in the direction of the ion beam is connected as the earth.

5. Ion beam gun according to claim 2, characterized in that the extraction electrode (23) is arranged so that it is displaceable with respect to its distance to the second electrode (22) in the direction of the ion beam.

6. Ion beam gun according to claim 4, characterized in that the extraction electrode (23) is arranged so that it is displaceable with respect to its distance to the second electrode (22) in the direction of the ion beam.

* * * * *

UNITED STATES PATENT AND TRADEMARK OFFICE
CERTIFICATE OF CORRECTION

PATENT NO. : 4,521,719

DATED : June 4, 1985

INVENTOR(S) : Gerhard Liebel

It is certified that error appears in the above-identified patent and that said Letters Patent is hereby corrected as shown below:

I Claim:

1. Ion beam gun (1) comprising an ionization chamber (5) whic is provided with an ionization gas inlet (6) and an ionization gas outlet (7), two ionization electrodes (11,12) spaced from and in opposition to each other in the direction of the ion beam for ionizing the ionization gas; an extraction electrode (13) permeabl to the ion beams, said extraction electrode (13), being arranged behind said two ionization electrodes (11,12) in the direction of the ion beam; means for applying a high frequency and a high voltage to said two ionization electrodes (11,12), one of said two ionization electrodes (11,12), disposed between the other of said two ionization electrodes (11,12) and said extraction electrode (13) and said extraction electrode (13) each being provided with passages (14,15) arranged in alignment with each other for passage of the ion beam.

Signed and Sealed this

Second Day of September 1986

[SEAL]

Attest:

DONALD J. QUIGG

Attesting Officer

Commissioner of Patents and Trademarks